United States Patent
Yamada et al.

(10) Patent No.: US 6,768,052 B2
(45) Date of Patent: Jul. 27, 2004

(54) FLEXIBLE PRINTED CIRCUIT WITH EMI PROTECTION

(75) Inventors: Tsukasa Yamada, Sagamihara (JP); Ren Sugiyama, Sagamihara (JP); Masanobu Fujii, Ebina (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/279,597

(22) Filed: Oct. 24, 2002

(65) Prior Publication Data

US 2003/0150631 A1 Aug. 14, 2003

(30) Foreign Application Priority Data

Feb. 8, 2002 (JP) ......................................... 2002-032396

(51) Int. Cl.[7] ................................................ H05K 9/00
(52) U.S. Cl. ........................ 174/35 R; 174/254; 174/255
(58) Field of Search ........................ 174/35 R, 35 GC, 174/35 MS, 250, 254, 255, 261, 264; 361/816, 818

(56) References Cited

U.S. PATENT DOCUMENTS

| | | | | |
|---|---|---|---|---|
| 5,061,824 A | * | 10/1991 | Alexander et al. | .......... 174/250 |
| 5,270,493 A | * | 12/1993 | Inoue et al. | ................. 174/253 |
| 5,513,078 A | * | 4/1996 | Komrska et al. | ............ 361/816 |
| 5,557,843 A | * | 9/1996 | McKenney et al. | ........... 29/851 |
| 5,571,608 A | * | 11/1996 | Swamy | ....................... 428/137 |
| 6,333,466 B1 | * | 12/2001 | Miyaake et al. | ............. 174/254 |
| 6,538,211 B2 | * | 3/2003 | St. Lawrence et al. | ..... 174/258 |

* cited by examiner

*Primary Examiner*—Dean A. Reichard
*Assistant Examiner*—Carmelo Oliva
(74) *Attorney, Agent, or Firm*—Frishauf, Holtz, Goodman & Chick, P.C.

(57) ABSTRACT

In a flexible printed circuit (10) for electrically connecting between a fixed portion and a movable portion comprising a flexible base layer (11), a conductive layer (13) formed on a principal surface (11a) of the flexible base layer through a first adhesive agent (12), and a cover lay (15) formed on the conductive layer through a second adhesive agent (14), copper foil (22) is pasted on an upper surface (15a) of the cover lay through a conductive adhesive agent (21). The copper foil is electrically connected to a ground portion (110) using solder. The fixed portion may be an optical disc drive's body (300). The movable portion may be an optical pickup unit (100) comprising an electromagnetic radiation source (200). The copper foil is for shielding electromagnetic noises radiated from the electromagnetic radiation source. The copper foil may be disposed only the vicinity of the electromagnetic radiation source.

5 Claims, 6 Drawing Sheets

FLEXIBLE PRINTED CIRCUIT WITH EMI PROTECTION

BACKGROUND OF THE INVENTION

This invention relates to a flexible printed circuit (FPC) including a means for decreasing electromagnetic noises radiated from the flexible printed circuit and, more particularly, to electromagnetic noises protection of the flexible printed circuit for use in electrically connecting between a body (a fixed portion) of an optical disc drive and an optical pickup unit (a movable portion), contained therein and including an electromagnetic radiation source, that records/reproduces data in/from an optical recording medium (an optical disc) such as a CD-R (compact disc-recordable), a CD-RW (CD-rewritable), a DVD (digital versatile disc) or the like.

In the manner known in the art, a flexible printed circuit is a circuit for use in electrically connecting between a fixed portion and a movable portion. For example, when the fixed portion comprises a body of an optical disc drive, the movable portion comprises an optical pickup unit contained therein. The optical pickup unit is disposed so as to be opposed to an optical disk rotating with a predetermined distance left therebetween and so as to slidably move against the body of the optical disc drive.

The optical pickup unit is a unit which carries out recording (writing) or erasing of information by converging a laser beam produced by a semiconductor laser serving as an optical source on a signal recording face of an optical disc through an objective lens and which carries out reproducing of information by detecting a reflected beam (a return beam) from the signal recording face by a photodetector serving as optical detecting means.

Inasmuch as it is necessary to carry out transmission/reception of information between the optical pickup unit serving as the movable portion and the optical disc drive's body serving as the fixed portion, therebetween are electrically connected by the flexible printed circuit. For instance, signals for transmitting from the optical disc drive's body to the optical pickup unit may be a signal for driving a semiconductor laser, a current flowing in coils of an actuator for driving the objective lens in a focus direction and a tracking direction. On the other hand, signals for transmitting from the optical pickup unit to the optical disk drive's body may be a signal detected by the photodetector or the like.

Now, there is the optical pickup unit including an electromagnetic radiation source mounted thereon. On the other hand, the flexible printed circuit comprises a flexible base layer on which a plurality of signal lines are formed. Each signal line in the flexible printed circuit serves as an electromagnetic antenna. That is, radiated from the electromagnetic radiation source, electromagnetic noises are transmitted on the signal lines and are radiated from the signal lines to the outside.

In the optical pickup unit including the electromagnetic radiation source mounted thereon, it is important to provide electromagnetic interference (EMI) protection because the electromagnetic noises affect electronic apparatuses each other. If any EMI protection is not provided for the flexible printed circuit, it is impossible to shield the electromagnetic noises because each signal line in the flexible printed circuit acts as the electromagnetic antenna.

In order to shield the electromagnetic noises, a conventional flexible printed circuit in which an EMI protection is provided comprises a ground layer. However, in order to form the ground layer, it is necessary for the flexible printed circuit to make multiple layers. As a result, the conventional flexible printed circuit where the EMI protection is performed is disadvantageous in that additional cost is incurred in the flexible printed circuit.

SUMMARY OF THE INVENTION

It is therefore an object of this invention to provide a flexible printed circuit which is capable of shield electromagnetic noises.

It is therefore another object of this invention to provide a flexible printed circuit of the type described, which has a low cost.

Other objects of this invention will become clear as the description proceeds.

On describing the gist of this invention, it is possible to be understood that a flexible printed circuit is for electrically connecting between a fixed portion and a movable portion. The flexible printed circuit comprises a flexible base layer having a principal surface and a lower surface. A conductive layer is formed on the principal surface of the flexible base layer through a first adhesive agent. A cover lay is formed on the conductive layer through a second adhesive agent. The cover lay has an upper surface.

According to an aspect of this invention, the above-mentioned flexible printed circuit further comprises foil made of conductive material pasted on at least one of the lower surface of the flexible base layer and the upper surface of the cover lay through a third adhesive agent. The foil is electrically connected to a ground portion.

In the afore-mentioned flexible printed circuit, the foil may comprise copper foil. The third adhesive agent preferably may comprise a conductive adhesive agent. Electrical connection between the foil and the ground portion may be made using solder. The conductive layer comprises various signal lines including a power supply line and a ground line. The foil may be pasted on the at least one of the lower surface of the flexible base layer and the upper surface of the cover lay so as to cover at least the power supply line and the ground line.

In the afore-mentioned flexible printed circuit, the fixed portion may be a body of an optical disc drive. The movable portion may be an optical pickup unit comprising an electromagnetic radiation source. In this event, the foil is for shielding electromagnetic noises radiated from the electromagnetic radiation source. The foil may be disposed only the vicinity of the electromagnetic radiation source. The conductive layer comprises various signal lines including a power supply line and a ground line. The foil may be pasted on the at least one of the lower surface of the flexible base layer and the upper surface of the cover lay so as to cover at least the power supply line and the ground line.

DESCRIPTION OF THE PREFERRED EMBODIMENT

Figure 1:
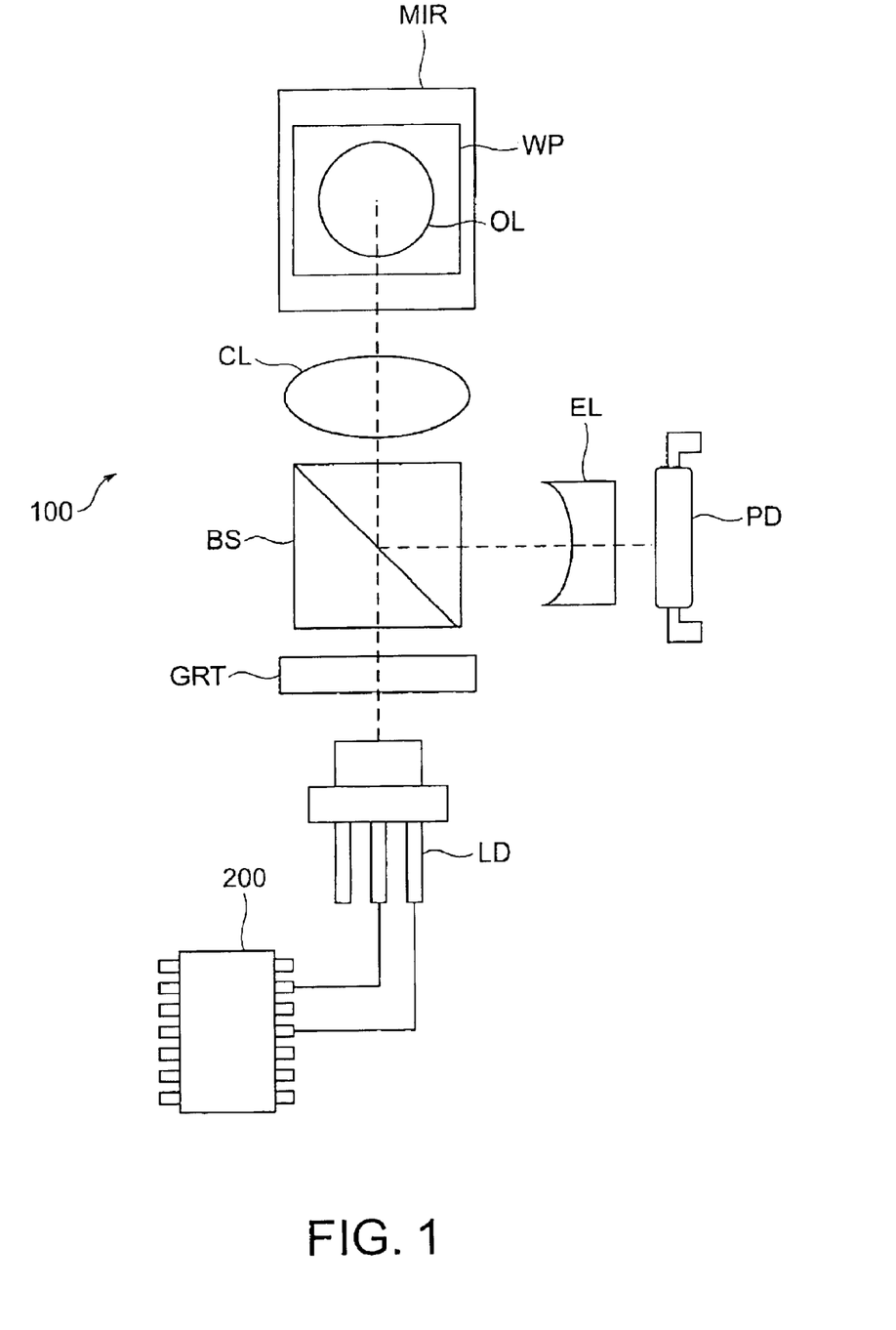
FIG. 1 is a plan view showing an optical system of an optical pickup unit including an electromagnetic radiation source.

Referring to FIG. 1, an optical pickup unit 100 including an electromagnetic radiation source (which will later be described) will be described at first in order to facilitate an understanding of the present invention. FIG. 1 is a plan view showing an optical system of the optical pickup unit 100. The illustrated optical pickup unit 100 is a type which uses a polarization optical system as the optical system. The "polarization optical system" is the optical system which is capable of changing a polarization direction of a laser beam.

The optical pickup unit 100 comprises a semiconductor laser (laser diode) LD, a diffraction grating GRT, a beam splitter BS, a collimator lens CL, a rising mirror MIR, a wave plate WT, an objective lens OL, a concave lens (enlargement lens) EL, and a photodetector (light receiving element) PD, and a forward sensor (not shown). The diffraction grating GRT is disposed between the semiconductor laser LD and the beam splitter BS. The forward sensor may be disposed, for example, at a left-side hand of the beam splitter BS.

In the optical pickup unit 100 with such a structure, disposed this side, the semiconductor laser LD radiates a laser beam in the horizontally forward direction. The outgoing laser beam is separated into three laser beams by the diffraction grating GRT and transmits the beam splitter BS to go in the horizontally forward direction. In addition, the beam splitter BS separates the incident laser beam into a reflected beam and a transmitted beam at a constant ratio. For example, the beam splitter BS reflects 20% of the incident laser beam as the reflected beam and transmits 80% of the incident laser beam as the transmitted beam. That is, 20% of the incident laser beam is bent at a right angle by the beam splitter BS to go horizontally leftward as the reflected beam. The forward sensor is also called a front monitor and is for monitoring a light amount of the reflected beam from the beam splitter BS. The laser beam, which goes in the horizontally forward direction, is collimated into a collimated beam by the collimator lens CL and thereafter is bent at a right angle by reflecting at a reflecting surface of the rising mirror MIR to go vertically upward. The laser beam, which goes vertically upward, has a polarization direction which is changed by the wave plate WP and is converged (irradiated) on a signal recording face of an optical disc (not shown) through the objective lens OL. Thereby, it is possible to write (record) information to the optical disc or erase information from the optical disc.

The wave plate WP may comprise a half-wave plate or a quarter-wave plate. Such a wave plate WP consists of a transparent plate made of, as a material, a crystal having birefringence such as a rock crystal. It is known in the art that the wave plate WP comprises functional resin and a pair of glass plates which sandwich the functional resin therebetween.

Reflected by the signal recording face of the optical disc, a reflected laser beam (return laser beam) goes vertically downward, and passes through the objective lens OL. After the polarization direction thereof is changed by the wave plate WT, the return laser beam is bent at a right angle by reflecting at the reflecting surface of the rising mirror MIR to go horizontally backward. The laser beam, which goes horizontally backward, transmits the collimator lens CL, is bent at a right angle by the beam splitter BS to go horizontally rightward, and is detected by the photodetector PD through the concave lens EL. Thereby, it is possible to reproduce information stored (recorded) in the optical disc.

In addition, optical parts, such as the semiconductor laser LD, the diffraction grating GRT, the beam splitter BS, the collimator lens CL, the rising mirror MIR, the concave lens EL, the photodetector PD, the wave plate WP, and the forward sensor (not shown) are held in an optical base (not shown). The objective lens OL is held in a lens holder (not shown) and the lens holder is slightly movably supported by the optical base.

In addition, the illustrated semiconductor laser LD comprises a high power semiconductor laser which enable to produce a laser beam having a wavelength, for example, of 780 nm. That is, the semiconductor laser LD produces the laser beam having high power on recording information to the optical disc while the semiconductor laser LD produces the laser beam having low power on reproducing the information recorded in the optical disc.

In the manner which is described above, the above-mentioned optical pickup unit 100 selectively produces the laser beam of the high power for recording and the laser beam of the low power for reproducing by using the high power semiconductor laser LD. The semiconductor laser LD normally oscillates at a single transverse mode. Such as a semiconductor laser LD oscillating at the single transverse mode is weak for the return laser beam reflected by the signal recording face of the optical disc and has an unstable oscillation. Such a phenomenon has great effect on reading of a signal in the photodetector on reproduction (at the low power).

As a result, the optical pickup unit 100 for recording/reproducing using the high power semiconductor laser LD makes the high power semiconductor laser LD operate at a multi-mode of an oscillation spectrum by high-frequency superimposition using a high-frequency superimposition circuit 200 on reproduction. Thereby, coherence between the irradiated laser beam from the semiconductor laser LD and the return laser beam thereto is reduced and a stable oscillation of the high power semiconductor laser LD is realized.

The high-frequency superimposition using the high-frequency superimposition circuit 200 turns the semiconductor laser LD on/off at a fundamental frequency (fundamental wave) of 350 MHz. Accordingly, the high-frequency superimposition circuit 200 oscillates not only a fundamental wave component of the fundamental frequency of 350 MHz but also harmonic frequency components (specifically, a third harmonic frequency component of a third harmonic frequency of 1050 MHz. That is, the high-frequency superimposition circuit 200 serves as an electromagnetic radiation source for radiating electromagnetic noises, as mentioned in the preamble of the instant specification. As a result, in the optical pickup unit 100 including the electromagnetic radiation source 200 mounted thereon, it is important to provide electromagnetic interference (EMI) protection.

On the other hand, as mentioned in the preamble of the instant specification, inasmuch as each signal line in a flexible printed circuit (FPC) serves as an electromagnetic antenna, it is impossible to shield the electromagnetic noises if any EMI protection is not provided for the flexible printed circuit.

Figure 2:
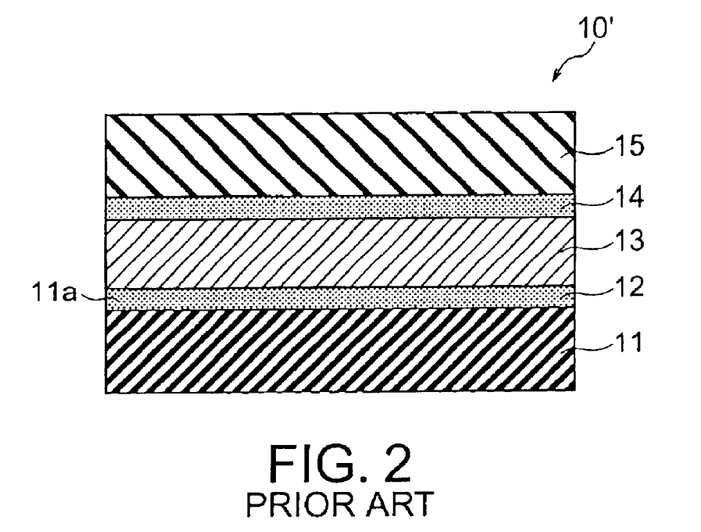
FIG. 2 is a cross section showing a first conventional flexible printed circuit where any EMI protection is not provided therefor.

FIG. 2 shows a cross section of a first conventional flexible printed circuit 10' where any EMI protection is not provided therefor.

The first conventional flexible printed circuit 10' comprises a flexible base layer 11 having a principal surface 11a, a conductive layer 13 formed on the principal surface 11a or the base layer 11 through a first adhesive agent 12, and a cover lay 15 formed on the conductive layer 13 through a second adhesive agent 14. The conductive layer 13 is composed of a plurality of signal lines.

Inasmuch as the first conventional flexible printed circuit 10' having such structure provides any EMI protection therefor, it is impossible to shield the electromagnetic noises.

Figure 3:
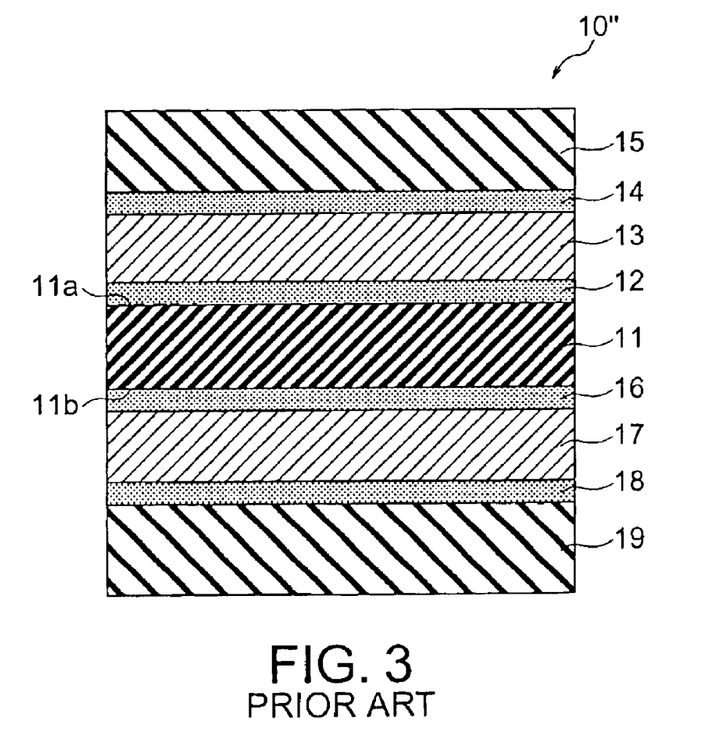
FIG. 3 is a cross section showing a second conventional flexible printed circuit where an EMI protection is provided therefor.

FIG. 3 shows a cross section of a second conventional flexible printed circuit 10" where an EMI protection is provided therefor.

The second conventional flexible printed circuit 10" comprises not only the flexible base layer 11, the first adhesive agent 12, the conductive layer 13, the second adhesive agent 14, and the covey lay 15 which comprise the first conventional flexible printed circuit 10' illustrated in FIG. 2 but also a ground layer 17 formed on a back surface (a lower surface) 11b of the flexible base layer 11 through a third adhesive agent 16 and a second cover lay 19 formed on the ground layer 17 through a fourth adhesive agent 18.

That is, in the second conventional flexible printed circuit 10", the ground layer 17 is formed in order to reduce the radiation of the electromagnetic noises and thereby shields the electromagnetic noises.

In the manner which is described above, in the second conventional flexible printed circuit 10" where the EMI protection is provided therefor, it is necessary for the flexible printed circuit 10" to make multiple layers in order to form the ground layer 17. As a result, the second conventional flexible printed circuit 10" where the EMI protection is performed is disadvantageous in that additional cost is incurred in the flexible printed circuit 10".

Figure 4:
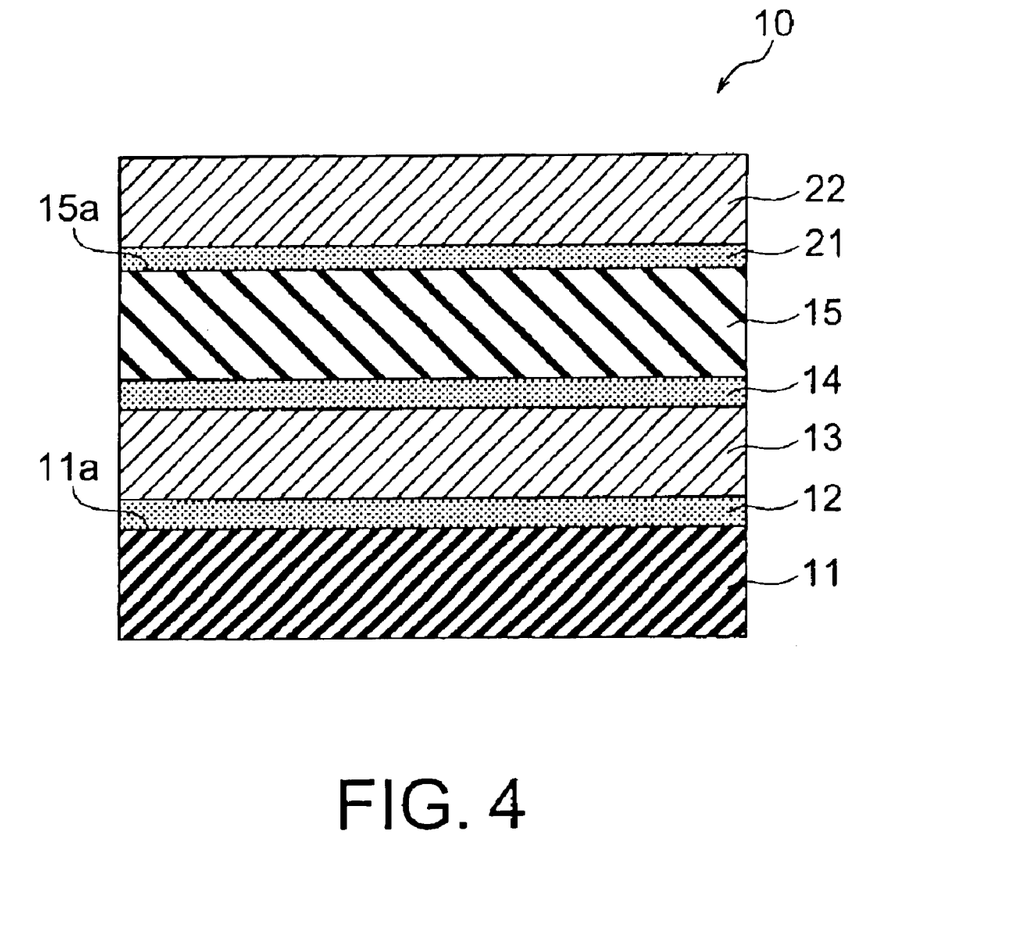
FIG. 4 is a cross section showing a flexible printed circuit according to a first embodiment of this invention.

Referring to FIG. 4, the description will proceed to a flexible printed circuit (FPC) 10 according to a first embodiment of this invention.

The illustrated flexible printed circuit 10 is similar in structure and operation of the first conventional flexible printed circuit 10' illustrated in FIG. 2 except that the flexible printed circuit 10 further comprises copper foil 22 which is soldered to a ground portion (which will later be described). Accordingly, components having similar functions of those illustrated in FIG. 2 are attached with the same reference symbols and description thereof will be omitted in order to simplify description and to avoid repeated description.

The copper foil 22 is pasted on an upper surface 15a of the cover lay 15 through a conductive adhesive agent 21. As a result, it is possible to shield the electromagnetic noises (it is possible to reduce a level of the electromagnetic noises).

For instance, there is EMC (electromagnetic compatibility) standards based on FCC15B-Class B in the United States of America. It will be assumed that the electromagnetic radiation source comprises the high-frequency superimposition circuit 200 mounted on the optical pickup unit 100. Under the circumstances, the present inventors examined whether or not the above-mentioned EMC standards are satisfied in a case where the first conventional flexible printed circuit 10' illustrated in FIG. 2 is used as an examined flexible printed circuit and a case where the flexible printed circuit 10 according to the embodiment of this invention illustrated in FIG. 4 is used as the examined flexible printed circuit.

As a result, in the case where the examined flexible printed circuit is the first conventional flexible printed circuit 10' illustrated in FIG. 2, the present inventors confirmed that there is hardly any margin although the above-mentioned EMC standards are satisfied at the fundamental frequency of 350 MHz and the third harmonic frequency of 1050 MHz.

On the other hand, in the case where the examined flexible printed circuit is the flexible printed circuit 10 according to the embodiment of this invention illustrated in FIG. 4, the present inventors confirmed that the above-mentioned EMC standards are satisfied with a margin of 8 dB or more both at the fundamental frequency of 350 MHz and at the third harmonic frequency of 1050 MHz. That is, it is understood that the flexible printed circuit 10 according to the embodiment of this invention illustrated in FIG. 4 can shield the electromagnetic noises in comparison with the first conventional flexible printed circuit 10' illustrated in FIG. 2.

Figure 5:
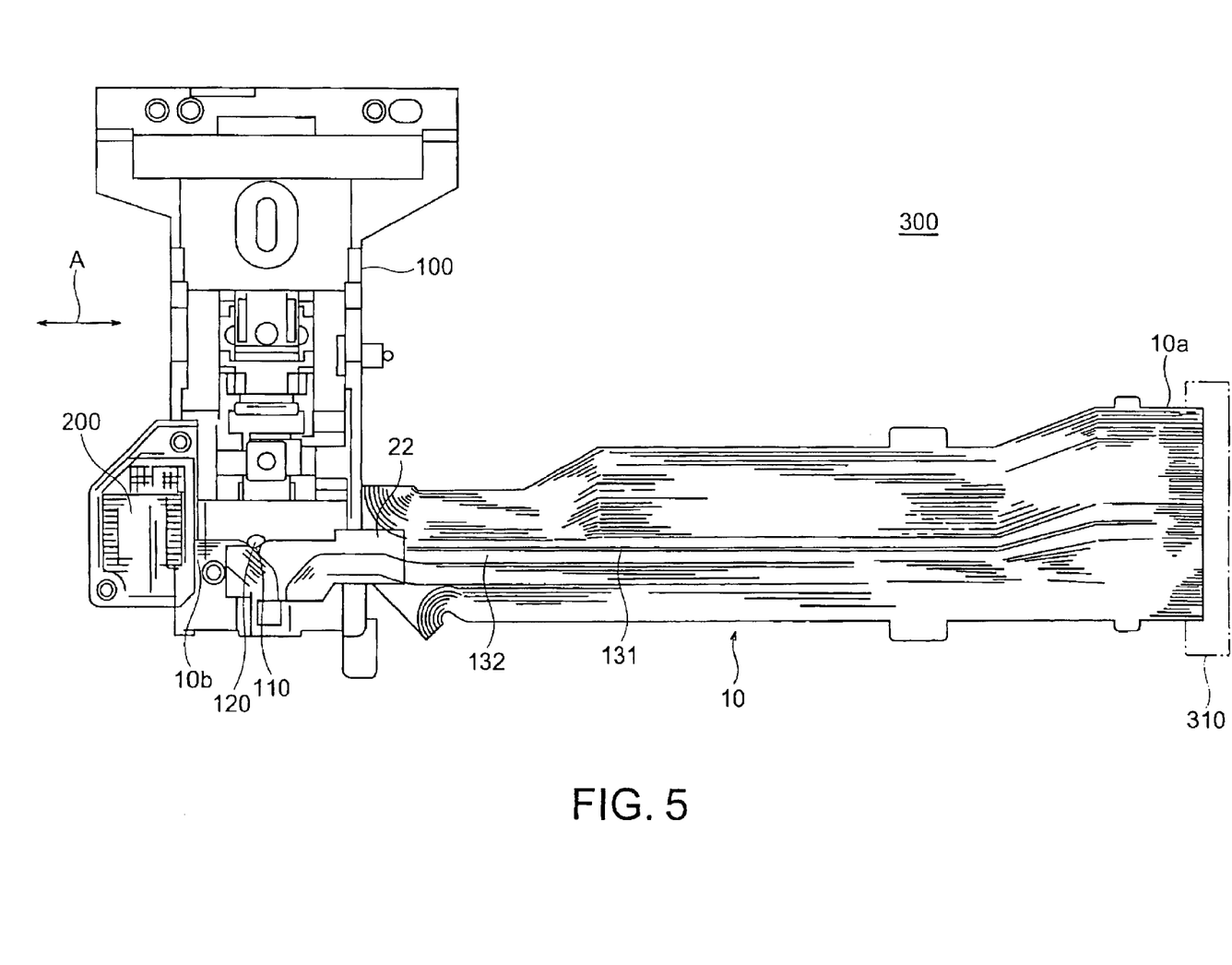
FIG. 5 is a plan view showing an optical pickup unit including an electromagnetic radiation source to which the flexible printed circuit illustrated in FIG. 4 is applied.

FIG. 5 shows an example where the flexible printed circuit 10 illustrated in FIG. 4 is applied to an optical disc drive. The illustrated example is a case where a fixed portion is a body 300 of the optical disc drive and a movable portion is the optical pickup unit 100 which is contained in the optical disc drive and which includes the electromagnetic radiation source (the high-frequency superimposition circuit) 200 mounted thereon.

The illustrated flexible printed circuit 10 electrically connects between the optical disc drive's body (the fixed portion) 300 and the optical pickup unit (the movable portion) 100. The optical pickup unit 100 is disposed opposite a rotating optical disc (not shown) with a predetermined distance left therebetween and is composed so as to slidably move against the optical disc drive's body 300 in a direction depicted at an arrow A.

The flexible printed circuit 10 has an end 10a which is electrically connected to a connector 310 of the optical disc drive's body 300. The flexible printed circuit 10 has another end 10b which is electrically connected to the optical pickup unit 100.

As shown in FIG. 5, the copper foil 22 is soldered to the ground portion depicted at 110 of the optical pickup unit 100. In other words, electrical connection between the copper foil 22 and the ground portion 110 is made using solder 120. In the example being illustrated, the copper foil 22 is disposed only the vicinity of the high-frequency superimposition circuit 200 acting as the electromagnetic radiation source.

In the manner as well known in the art, the optical pickup unit 100 slidably moves against the optical disc drive's body 300 in the direction depicted at the arrow A. As a result, during sliding movement of the optical pickup unit 100, the flexible printed circuit 10 has a center portion which is put into a curved state or into a stretched state. However, the flexile printed circuit 100 has a portion on and near the optical pickup unit 100 that is fixed on the optical pickup unit 100. Accordingly, in the example being illustrated, the copper foil 22 is pasted on only the portion of the flexible printed circuit 10 that is fixed on the optical pickup unit 100. This is because, if the copper foil 22 is pasted on also the center portion of the flexible printed circuit 10 that is bent or stretched whenever the optical pickup unit 10 slidably moves in the manner which is described above, it is feared that the copper foil 22 peels off the cover lay 15.

In addition, in the flexible printed circuit 10 where the copper foil 22 is pasted on the cover lay 15 only on and near the optical pickup unit 100 as illustrated in FIG. 5, the present inventors confirmed that the copper foil 22 does not peel off the covey lay 15 and there is no change in a shield effect of the electromagnetic wave although the optical pickup unit 100 is repeatedly slidably moved against the optical disc drive's body 300 along the direction of the arrow A two million times.

In the manner as known in the art, the conductive layer 13 shown in FIG. 4 comprises various signal lines including a power supply line 131 and a ground line 132. In the example being illustrated, the copper foil 22 is pasted on the upper surface 15*a* of the cover lay 15 so as to cover at least the power supply line 131 and the ground line 132.

At any rate, in the embodiment of this invention, the copper foil 22 is pasted on the upper surface 15*a* of the cover lay 15 through the conductive adhesive agent 21 so as to cover the various signal lines such as the power supply line 131 and the ground line 132 and is soldered to the ground portion 110. Thereby, the copper foil 22 serves as a ground layer in the flexible printed circuit 10 according to the embodiment of this invention and it is possible to strengthen the ground equivalent to that of the second conventional flexible printed circuit 10" of the multi-layer type as illustrated in FIG. 3.

Although the copper foil 22 is pasted on the upper surface 15*a* of the cover lay 15 at a side of the optical pickup unit 10 in the flexible printed circuit 10 illustrated in FIG. 5, it is understood that it may have an effect for shielding the electromagnetic noises although the copper foil 22 is pasted on the upper surface 15*a* of the cover lay 15 at a side connected to the connector 310 or the optical disc drive's body 300.

While this invention has thus far been described in conjunction with an embodiment thereof, it will now be readily possible for those skilled in the art to put this invention into various other manners. For example, foil made of conductive material except for copper may be used as the foil pasted on the upper surface 15*a* of the cover lay 15 although the copper foil 22 is used in the above-mentioned embodiment. In addition, pasting between the foil made of conductive material (the copper foil 22) and the cover lay 15 may be carried out by using a normal adhesive agent although the conductive adhesive agent 21 is used in the above-mentioned embodiment. Furthermore, electrical connection between the foil made of the conductive material (the copper foil 22) and the ground portion 110 is made by gluing using conductive material except for the solder, although the solder 120 is used in the above-mentioned embodiment.

Figure 6:
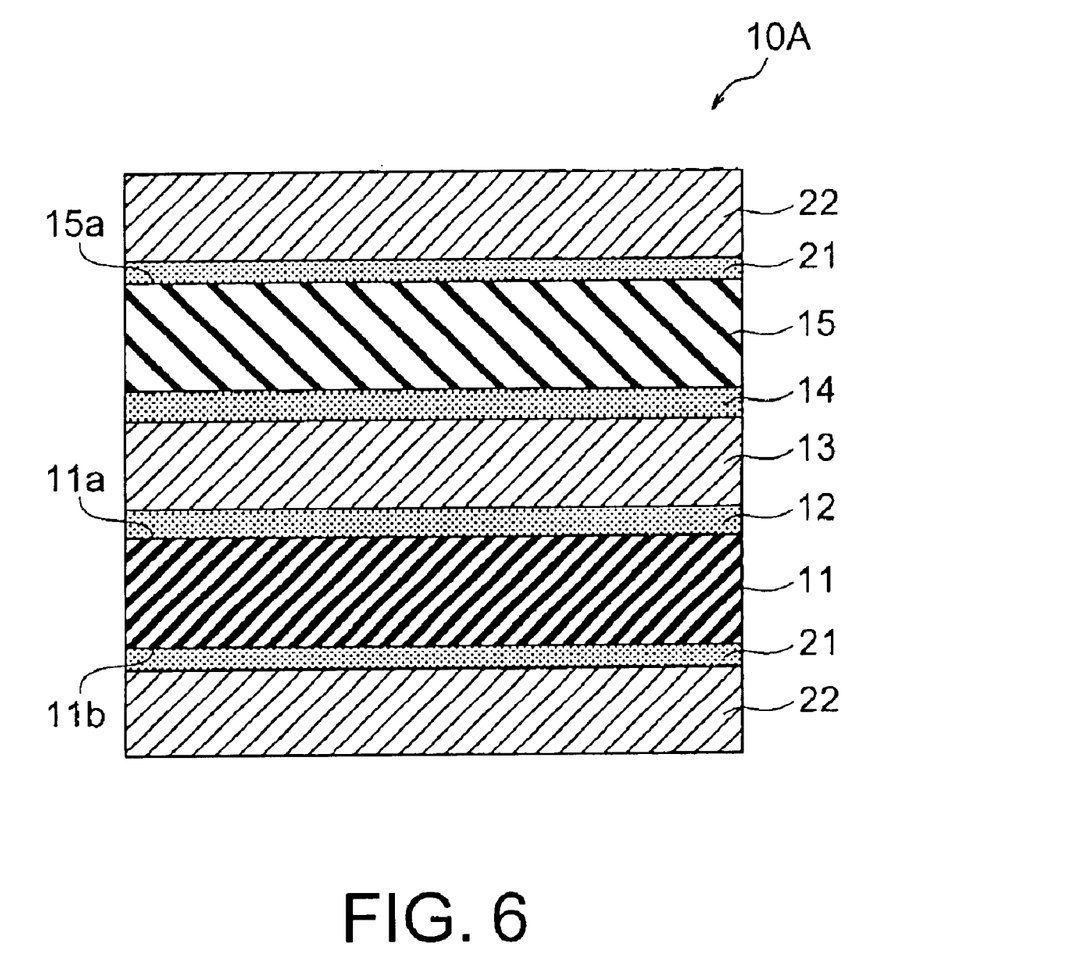
FIG. 6 is a cross section showing a flexible printed circuit according to a second embodiment of this invention.
Figure 7:
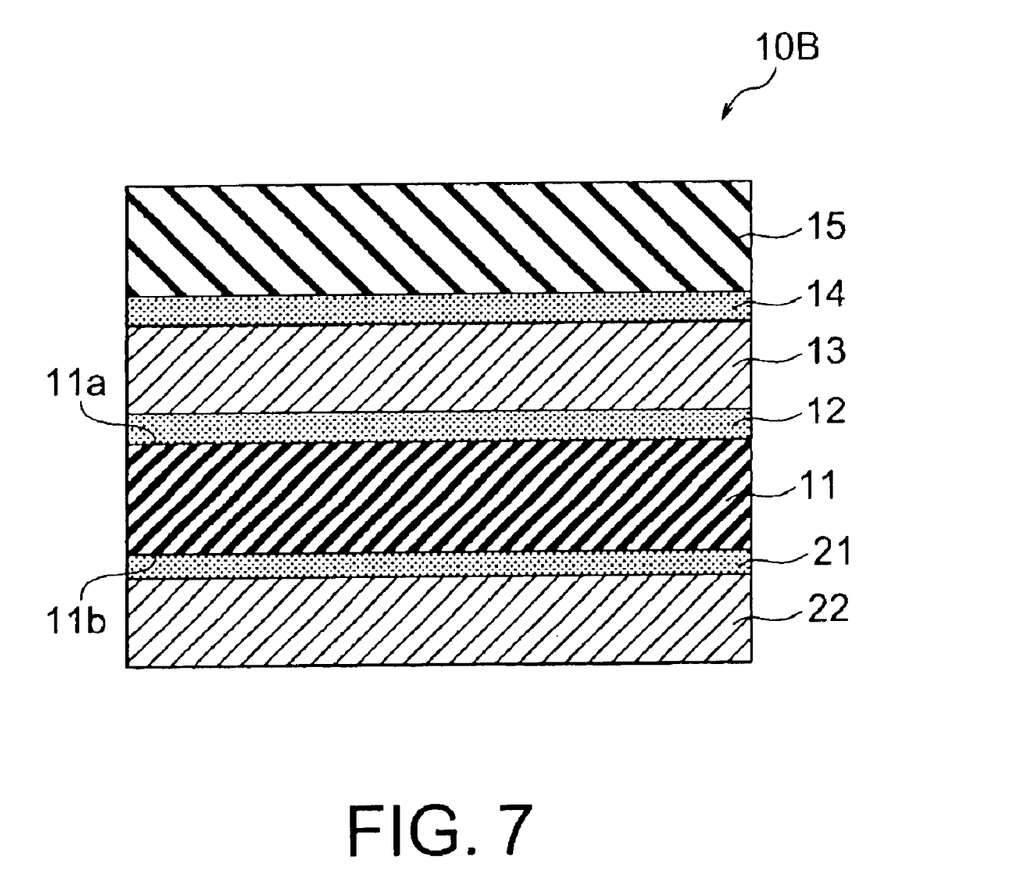
FIG. 7 is a cross section showing a flexible printed circuit according to a third embodiment of this invention.

Although the foil made of the conductive material (the copper foil 22) is pasted on the upper surface 15*a* of the cover lay 15 in the above-mentioned embodiment, the foil made of the conductive material (the copper foil 22) may be pasted on both of a lower surface 11*b* of base layer 11 and the upper surface 15*a* of the cover lay 15 in a flexible printed circuit 10A according to a second embodiment of this invention as illustrated in FIG. 6 or the foil made of the conductive material (the copper foil 22) may be pasted on only the lower surface 11*b* of the base layer 11 in a flexible printed circuit 10B according to a third embodiment of this invention as illustrated in FIG. 7.

What is claimed is:

1. A flexible printed circuit for electrically connecting between an optical disc drive and an optical pickup unit comprising an electromagnetic radiation source, said flexible printed circuit comprising:

a flexible base layer having a principal surface and a lower surface;

a conductive layer formed on the principal surface of said flexible base layer through a first adhesive agent;

a cover lay formed on said conductive layer through a second adhesive agent, said cover lay having an upper surface; and foil made of conductive material, disposed only near said electromagnetic radiation source, pasted on at least one of the lower surface of said flexible base layer and the upper surface of said cover lay through a third adhesive agent only on and near said optical pickup unit, said foil being electrically connected to a ground portion of said optical pickup unit, said foil shielding electromagnetic noise radiated from said electromagnetic radiation source.

2. A flexible printed circuit as claimed in claim 1, wherein said foil comprises copper foil.

3. A flexible printed circuit as claimed in claim 1, wherein said third adhesive agent comprises a conductive adhesive agent.

4. A flexible printed circuit as claimed in claim 1, wherein electrical connection between said foil and said ground portion is made using solder.

5. A flexible printed circuit as claimed in claim 1, wherein said conductive layer comprises various signal lines including a power supply line and a ground line, said foil being pasted on said at least one of the lower surface of said flexible base layer and the upper surface of said cover lay so as to cover at least said power supply line and said ground line.

* * * * *